United States Patent [19]

Ikeda et al.

[11] Patent Number: 5,310,531
[45] Date of Patent: May 10, 1994

[54] POLYCRYSTALLINE SILICON ROD FOR FLOATING ZONE METHOD AND PROCESS FOR MAKING THE SAME

[75] Inventors: Yasuhiro Ikeda; Kyoji Oguro, both of Annaka, Japan

[73] Assignee: Shin-Etsu Handotai Co., Ltd., Tokyo, Japan

[21] Appl. No.: 983,784

[22] Filed: Nov. 30, 1992

Related U.S. Application Data

[63] Continuation of Ser. No. 662,274, Feb. 28, 1991, abandoned.

[30] Foreign Application Priority Data

Feb. 28, 1990 [JP] Japan .................. 2-48954

[51] Int. Cl.⁵ .................................. C01F 3/00
[52] U.S. Cl. ...................... 423/324; 423/348; 117/50; 117/51
[58] Field of Search ............ 156/603, 605, 606, 616.2, 156/617.1, 620.7, 620.73, DIG. 64, DIG. 83, DIG. 115; 423/324

[56] References Cited

U.S. PATENT DOCUMENTS

| | | | |
|---|---|---|---|
| 3,773,499 | 11/1973 | Melnikov et al. | 156/620.7 |
| 4,196,041 | 4/1980 | Baghdadi et al. | 156/DIG. 64 |
| 4,312,700 | 1/1982 | Helmreich et al. | 156/DIG. 83 |
| 4,722,764 | 2/1988 | Herzer et al. | 156/DIG. 115 |
| 4,921,026 | 5/1990 | Flagella et al. | 156/620.73 |

Primary Examiner—Olik Chaudhuri
Assistant Examiner—Felisa Garrett
Attorney, Agent, or Firm—Scully, Scott, Murphy & Presser

[57] ABSTRACT

A polycrystalline silicon rod for preparing a monocrystalline silicon rod by a floating zone method, wherein at least a central portion of the section of the polycrystalline silicon rod has coarsened silicon monocrystalline grains around the center over an area of or above the minimum section of a molten zone during progress in the floating zone method and the outer peripheral portion of the coarsened region has fine monocrystalline grains. From the polycrystalline silicon rod, the monocrystalline silicon rod for a semiconductor is prepared with a high yield by the single floating zone method.

4 Claims, 3 Drawing Sheets

POLYCRYSTALLINE SILICON ROD FOR FLOATING ZONE METHOD AND PROCESS FOR MAKING THE SAME

This is a continuation of copending application Ser. No. 622,274, filed on Feb. 28, 1991, now abandoned.

BACKGROUND OF THE INVENTION

1. Field of the Invention

This invention relates to a polycrystalline silicon rod for preparing a monocrystalline silicon rod (or a single crystalline silicon rod) by a floating zone melting method (or a floating zone method) and a process for making the polycrystalline silicon rod, and particularly to the same for preparing the monocrystalline silicon rod for a semiconductor by the single floating zone method and the process for making the same.

2. Description of the Prior Art

The floating zone method has been developed by paying attention to properties of silicon that its density is relatively low and its surface tension is high, wherein a molten portion of silicon is lain between an unmelted portion of the polycrystalline silicon rod and a solidified portion thereof, a part of the molten portion is kept in a floating state (such molten portion is hereinafter referred to as a floating molten zone) and monocrystalline silicon is grown from a melt which is obtained by melting the polycrystalline silicon rod, without being brought into contact with a container to support the melt and any other materials.

In a vertical floating zone method, for example, Japanese Patent Publication No. 56-39048 describes that, with respect to a polycrystalline silicon rod with a seed crystal of monocrystalline silicon being attached to the lower end and which is vertically held, a boundary surface between the seed crystal and the polycrystalline rod is heated and molten by high frequency induction heating, electron beam heating, radiation heating or the like to form the floating molten zone and the thus molten portion is crystallized and the single crystal is grown, while gradually moving the above seed crystal portion downward with rotating and enlarging the size of said floating molten zone.

However, in the case of preparing the monocrystalline silicon rod from the polycrystalline silicon rod by the above floating zone method, the crystallization according to single passage of the floating molten zone does not result in satisfactory monocrystallization, and therefore the monocrystalline silicon rod is prepared through crystallization of the polycrystalline silicon rod in which at least two passages of the floating molten zone are carried out, in said first passage the polycrystalline silicon bar being in part monocrystallized.

Preparation of the single crystal by carrying out the at least two passages of the floating molten zone as mentioned above becomes a problem awaiting solution because much labor and time are necessary.

SUMMARY OF THE INVENTION

This invention aims at solving the above problem raised in the case that the single crystal is prepared by carrying out twice the passage of the floating molten zone.

It is an object of this invention to provide a polycrystalline silicon rod suitable for preparing monocrystalline silicon rod therefrom by a single passage of the floating molten zone through said polycrystalline rod and a process for making the polycrystalline rod.

The above object is accomplished by a polycrystalline silicon rod for preparing a monocrystalline silicon rod by a floating zone method, characterized by that at least the central portion of the radial section of the polycrystalline silicon rod has coarsened silicon monocrystal grains around the center over an area of or above the minimum section of a molten zone during a course of the floating zone method and the outer peripheral portion of the coarsened region in the section has micro monocrystal grains.

The above object is also accomplished by a method for making a polycrystalline silicon rod for preparing a monocrystalline silicone by a floating zone method, said polycrystalline silicon rod being in such that a polycrystalline silicon is deposited around a monocrystalline silicon rod by a chemical vapor growth method to result in the central portion of its section being composed of essentially a monocrystalline silicon structure, which comprises heating the monocrystalline silicon rod to a high temperature in a hydrogen gas stream, chemically etching the surface of the monocrystalline silicon rod and thereafter depositing the polycrystalline silicon by the chemical vapor growth method.

The monocrystalline silicon structure portion in the polycrystalline silicon rod is comprised of coarsened monocrystal grains, and said portion is formed over an area around the centre of the radial section the polycrystalline silicon rod, said area being equal to or larger than that of the minimum section of the molten zone during embodiment of the floating zone method. There is no fine or micro crystal grains in said area around the center and thus desirable melting can be realized and unmelted fine polycrystalline silicon particles do not flow down on the outersurface of the floating molten zone to a crystallization front, where if the particles get to the front, the crystallization will be disturbed. In contrast to the polycrystalline silicon rod of the prior art, a mono-crystalline silicon rod having no defect or less defect can be prepared from the polycrystalline silicon rod of this invention with much higher yield and as well by an single passage of the floating molten zone in the floating zone method. This is extremely economical as compared with the prior art.

BRIEF DESCRIPTION OF THE DRAWINGS

By way of example of the many features and advantages of the invention, an illustrative embodiment in the polycrystalline silicon rod for preparing the monocrystalline silicon rod is described below and shown in the accompanying drawings, in which.

DETAILED DESCRIPTION OF THE PREFERRED EMBODIMENT

Figure 1:
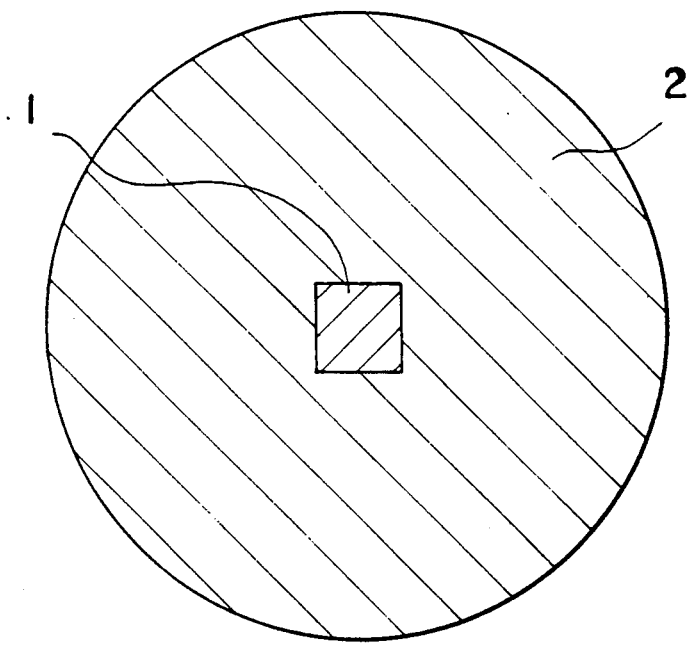
FIG. 1 shows a schematic view illustrating the section of the polycrystalline silicon rod according to the prior art.

According to this invention, in order to obtain the final monocrystalline silicon rod by a single passage of the floating molten zone in the zone melting method, the polycrystalline silicon rod is formed in such a manner that the section of the coarsened region having the coarsened silicon monocrystal grains which is provided with the central portion of the section becomes larger than the minimum section in the molten zone in the zone melting method.

The size of the section of the coarsened region is determined in such a manner that monocrystalline silicon is easily obtained by a single passage of the floating molten zone. At the present, in the case of the monocrystalline silicon rod prepared by the zone melting method, it is generally preferred that the section of the region of the coarsened monocrystal grains in the polycrystalline silicon rod is approximately circular and is 30 mm to 50 mm in diameter, since the monocrystalline silicone is prepared with a high yield.

In this invention, even if the central portion of the polycrystalline silicon rod is a polycrystalline structure on the whole, the unit monocrystal grain is coasened so that disorder of crystallization does not occur in the monocrystalline silicon rod which is prepared by the floating zone method. Therefore, in order to prepare the polycrystalline silicon rod of this invention, for example, a thin rod of monocrystalline silicon in the form of a square pillar which is cut out from a monocrystalline silicon rod is heated, for example, for 1 to 10 hours in a hydrogen atmosphere and further is subjected to a vapor chemical etching to cleanse the surface thereof and simultaneously to eliminate the surficial crystal defect. This heating and vapor etching of the thin rod composed of monocrystalline silicon can be carried out, for example, at a temperature range of 900° to 1200° C. under a hydrogen atmosphere and an atmosphere of hydrogen chloride or the like. It may be satisfactory to carry out the heating only under the hydrogen atmosphere. By carrying out the heating and vapor chemical etching as mentioned above, it is possible to remove a silicon oxide film which is naturally formed on the surface of the monocrystalline silicon of the thin rod and to cleanse the surface of monocrystalline silicon as a bulk.

In this invention, decomposed or reduced silicon atoms are deposited on the surface of the thin rod of monocrystalline silicon under such condition that a monocrystalline layer epitaxially grows thereon at least at an early stage.

This epitaxial growth can be carried out by the prior method, for example, by way of thermal decomposition or hydrogen reduction of trichlorosilane. Though the growth fails in general to go on as it physically means, this epitaxial growth is carried out at 1100° C. It is preferred to form at least larger crystal grains of crystalline silicon, because it is absolutely need to prepare a monocrystalline silicon rod with higher yields by the zone melting method.

In this invention, the region having a satisfactory size, wherein it is a polycrystalline structure on the whole but the unit monocrystal grain is coarsened, is formed in the central portion of the section of the polycrystalline silicon rod for preparing the monocrystalline silicon rod by the floating zone method, for example, along an overall length thereof. Therefore, when the floating zone is formed, unmelted polycrystal micrograins run down the surface of the molten zone from the polycrystalline portion during embodiment of the zone melting method at the upper part of a portion having the minimum diameter which is in the neighborhood of approximately the center in the longitudinal direction of the molten zone and attain to an exposed end of a solidified portion in the lower part of the molten zone, whereby the crystallization of the solidified portion is effected without being disordered or disarranged. In the case that the central portion of the polycrystalline silicon rod is composed of micro monocrystal grains, while these micro monocrystal grains are molten, the melting in the grain boundary therebetween progresses, the monocrystal grains are isolated in unmelted state, and the isolated grains are exposed on the surface of the molten zone according to difference in the specific gravity and cooled. As a result, the disordered crystal structure is presented. On the other hand, in the case that these monocrystal grains are coarsened as in this invention, the monocrystal grains cannot be easily isolated. Therefore, the monocrystallization in this invention becomes remarkably easy, particularly as compared with the case of extremely micro monocrystal grains around the centre of the polycrystalline rod.

When the section of the region in which the unit monocrystal grain is coarsened according to this invention is smaller in a diameter than the minimum section in the molten zone, the above effect cannot be expected.

In order to prepare the polycrystalline silicon rod of this invention which has a coarsened region of a unit monocrystal grain as mentioned above, the thin rod of monocrystalline silicon, for example, in the form of a square pillar or a column is provided as a core material for preparing the polycrystalline silicon rod and then the surface of the thin rod is heated at a high temperature under hydrogen and hydrogen chloride atmosphere, whereby oxides and other impurities of the surface are volatilized and removed and the resulting surface is free from disorder. This thin monocrystalline silicon rod is heated to a temperature of not less than 1000° C. by applying directly an electric current therethrough or an external radiation heating and is brought into contact with a mixture of a volatile compound of silicon such as trichlorosilane and hydrogen to allow silicon atoms to deposit thereon. Under such conditions, the surface of the thin monocrystal rod has approximately complete monocrystalline structure and thus silicon atoms to be deposited can epitaxially grow. Therefore, these deposited silicon atoms are not only built up as an aggregate of the coarsened monocrystal grains, but often is formed as a large monocrystalline region which is sufficiently recognizable by the naked eye, in the form of a square pillar with each side of about 5 mm. Also, there are cases where the monocrystalline region with a width of 1-4 mm is formed in the four directions $<110>$ perpendicular to each other from the side surface of the thin monocrystal rod with the axis derection of $<100>$ and toward the outer periphery in straight lines.

In the polycrystalline silicon rod of this invention, the unit monocrystal grain is coarsened preferably along the overall length at the central portion but it is recommendable that the outer periphery is formed by the polycrystalline layer composed of the minute or fine monocrystal grains. By making the monocrystal grain minute as mentioned above, the mechanical or thermal properties thereof lose any direction dependent property and, during the progress in the floating zone method, undesirable cracks do not occur in the unmelted portion of the polycrystalline silicon rod and also ununiform melting does not occur. Furthermore, this micro unit monocrystal grain in the outer layer causes no problem unlike that in the central portion Next, the embodiment of this invention will be described with reference to the example which follows but this invention is not limited or restricted by the following description and exemplification.

EXAMPLE 1

From a monocrystalline silicon rod, a monocrystalline silicon rod in the form of a square pillar having one side of the end of about 5 mm and a length of 90 mm (which corresponds to the aforementioned core material) was cut out with selected crystal plane wherein the longitudinal direction is in an axis <100> direction and its sides are in a plane {100}, and an etching was carried out in order to remove fine crystal particles attached when cutting out and residual stress in the surface layer portion. The etching allowance was 30 μm. After etching, the above square pillar monocrystalline silicon was washed with purified water and dried in an inert gas. The thus dried and cleansed square pillar monocrystalline silicon was heated for 10 hours at 1150° C. under a hydrogen atmosphere. By this heating, oxides which were formed on the surface of the square pillar monocrystalline silicon and the other surface attachments were removed.

After heating, the temperature was lowered to 1100° C. and trichlorosilane diluted with hydrogen was supplied around the above square pillar monocrystalline silicon to deposit a monocrystalline silicon thereon. Concentration of trichlorosilane at the initial stage of deposition was adjusted to a thinner state as compared to the later stages.

When monocrystalline silicon was deposited on the surface of the square pillar monocrystalline silicon in such manner as mentioned above and the diameter of the square pillar monocrystalline silicon came to 30 mm, the flow rate of the above diluted gas and the concentration of trichlorosilane were drastically increased and silicon was deposited on the face around the square pillar monocrystalline silicon by subjecting further trichlorosilane to pyrolysis or hydrogen reduction, to form a coating layer of the polycrystalline silicon comprising unit monocrystal grain which was microscopically as fine or minute as possible. In order to form the polycrystalline silicon coating layer comprising the above five unit monocrystal grain, the temperature of the polycrystalline rod may be temporarily lowered at the early stage.

Since the polycrystalline silicon rod of this example was prepared in such manner as mentioned above, it was possible to prepare monocrystalline silicon with yield of not less than 90% by a single passage of the floating molten zone in the floating zone method.

In the case that a monocrystalline silicon rod was prepared by using such polycrystalline silicon rod that all the deposition part except the core material portion having the same outer diameter was composed of the fine monocrystal grains and by a single passage of the floating molten zone the yield of the monocrystalline silicone was as low as not more than 10%.

In this example, the monocrystalline silicon rod in the form of the square pillar was cut out from a larger monocrystalline silicon rod to make the polycrystalline silicon rod for use in the floating zone method. However, a monocrystalline silicon rod may be cut out in the form of a cylindrical column having a diameter of about 5 mm therefrom to make a polycrystalline silicon rod.

In this case, for example, according to the prior technique which is a kind of the floating zone method, the above column-shaped core material was prepared directly from the polycrystalline rod by melting and solidifying it so as to attain a longitudinal crystal direction of <100>.

Next, the polycrystalline silicon rod according to this invention and the polycrystalline silicon rod according to the prior art will be explained with reference to photomicrographes and schematic drawings of the section thereof.

FIG. 1 shows a schematic sectional view of one embodiment of the polycrystalline silicon rod according to the prior art. As shown in the drawing, generally a central portion (1) of the polycrystalline silicon rod was formed with a thin monocrystalline rod (which corresponds to the core material) in the form of a cylindrical column or square pillar and polycrystals (2) were deposited around the thin rod. Even if the above thin monocrystalline rod was in the form of the square pillar and had an axis <100> of the longitudinal direction and a plane {110} of the four sides, when silicon was deposited according to the prior art, the polycrystalline silicon rod was formed in such manner that fine monocrystal grains became intricate in the disarranged or irregular direction and were grown as polycrystalline on the whole, and the outer most periphery thereof was in an approximately complete circle.

Figure 2:
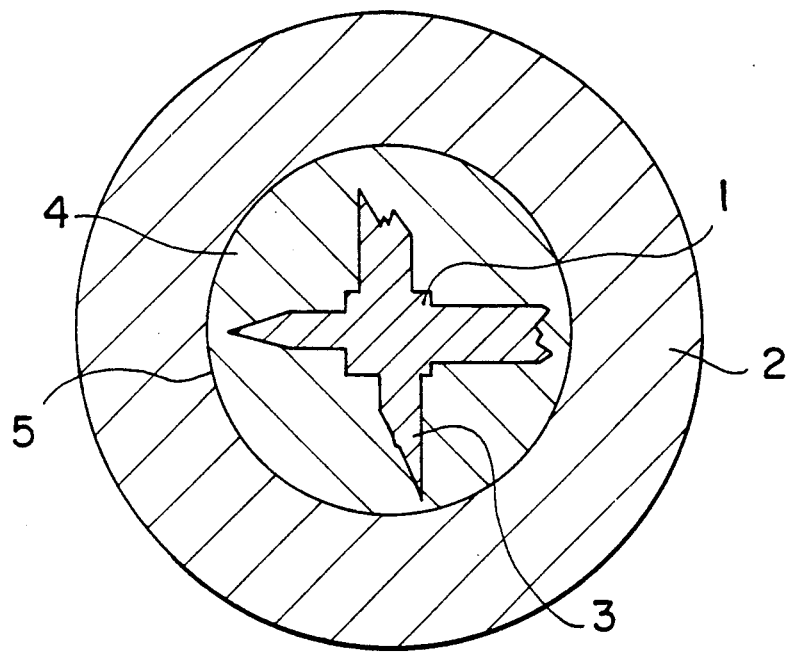
FIG. 2 shows a schematic view illustrating the section of the polycrystalline silicon rod according to one embodiment of this invention.
Figure 3:
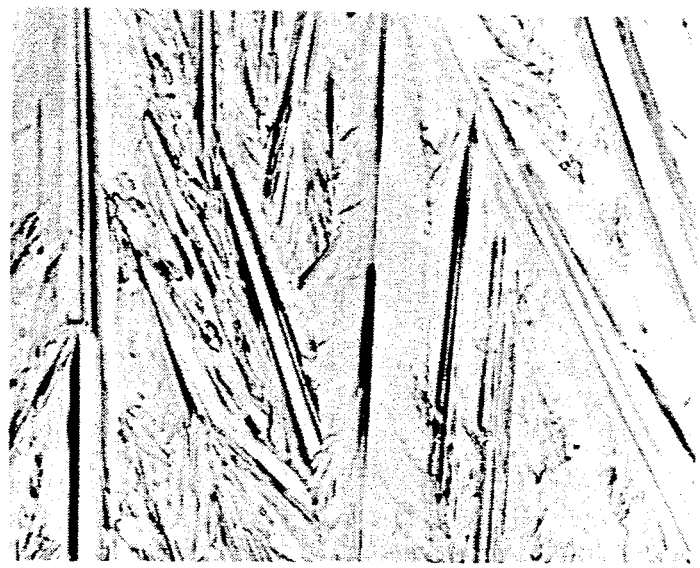
FIG. 3 shows a photomicrograph (200 magnifications) of the structure of the coarsened monocrystalline region in the polycrystalline silicon rod as shown in FIG. 2.

On the other hand, in the case that silicon was deposited on the above thin monocrystal rod (1), according to this invention, in such conditions that epitaxial growth is performed, a monocrystal (3) could be formed in the four radial directions with sizes which was sufficiently observable by the naked eye, as shown in FIG. 2. And, a region (4) surrouded with a line (5) was not clearly observed by the naked eye but it could be confirmed by a microscope that the monocrystalline grains were coarsened. When the microscope magnified this portion about 200 times, it could be observed that the needle-like unit monocrystal grains having a length of 2 to 3 mm were coarsened as shown in FIG. 3.

On the other hand, the unit monocrystal fine in the outer periphery (the outer layer portion of the line 5) 2 as shown in FIG. 2 was extremely small. When the microscope magnified the grain portion about 200 times, it could be observed that the shape of the grain was not clear and the size thereof was not more than one tenth as long as the unit monocrystal grain in the central polycrystalline portion (FIG. 4).

Figure 4:
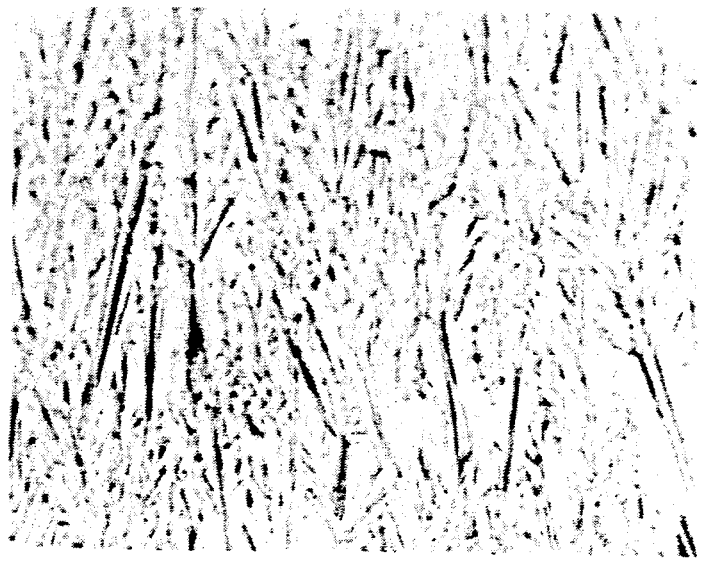
FIG. 4 shows a photomicrograph (200 magnifications) of the structure of the region formed on the outside of the coarsened monocrystalline region as shown in FIG. 3.

The size and gathering state of the unit monocrystal grain in the polycrystalline silicon rod according to the prior art was the same as those as shown in FIG. 4.

What is claimed is:

1. A polycrystalline silicon rod for preparing a monocrystalline silicon rod for a semiconductor by a floating zone method wherein the monocrystalline silicon rod is prepared by a single passage of the floating molten zone through said polycrystalline silicon rod, said polycrystalline silicon rod comprising:

(a) a monocrystalline silicon rod portion having a longitudinal axis in the <100> direction at the center of the radial section of the polycrystalline silicon rod, and a polycrystalline silicon portion formed around said monocrystalline silicon rod portion by a chemical vapor growth method; and
(b) a first region of the sectional area of said polycrystalline silicon portion which is formed of coarsened silicon monocrystal grains surrounding said monocrystalline silicon rod portion and a second region of said sectional area which is formed of fine silicon micro-monocrystal grains surrounding said first region of said polycrystalline silicon portion and said first region and the monocrystalline silicon rod portion combined having a sectional area larger than the minimum sectional area of the floating molten zone.

2. The polycrystalline silicon rod of claim 1 wherein the first region of said sectional area consists of densified aggregates of coarsened silicon monocrystalline needle-like grains of 2 mm to 3 mm in length and the monocrystalline silicon rod portion of the center of said polycrystalline silicon rod is about 5 mm thick.

3. The polycrystalline silicon rod of claim 2 wherein said first region of said sectional area is about 30 to about 50 mm in the outer diameter.

4. The polycrystalline silicon rod of claim 1 wherein the monocrystalline silicon rod portion is in the form of a square pillar with the four sides all in {110} planes.

* * * * *